United States Patent
Kwak

(10) Patent No.: US 8,879,337 B1
(45) Date of Patent: Nov. 4, 2014

(54) DYNAMIC BURST LENGTH OUTPUT CONTROL IN A MEMORY

(71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 13/867,544

(22) Filed: Apr. 22, 2013

(51) Int. Cl.
G11C 7/10 (2006.01)
G11C 7/22 (2006.01)

(52) U.S. Cl.
CPC ............... *G11C 7/106* (2013.01); *G11C 7/222* (2013.01)
USPC ............ 365/189.05; 365/189.17; 365/189.12; 365/233.1; 365/233.11

(58) Field of Classification Search
USPC .................. 365/189.05, 189.17, 189.12, 194, 365/233.1, 233.11
See application file for complete search history.

(56) References Cited

U.S. PATENT DOCUMENTS

| 5,920,511 | A | * | 7/1999 | Lee et al. ................. | 365/185.21 |
| 7,787,310 | B2 | * | 8/2010 | Johnson ................... | 365/189.02 |
| 8,030,981 | B2 | * | 10/2011 | Kim .............................. | 327/284 |
| 2011/0068844 | A1 | * | 3/2011 | Kup .............................. | 327/276 |

* cited by examiner

*Primary Examiner* — Fernando Hidalgo
(74) *Attorney, Agent, or Firm* — Schwegman Lundberg & Woessner, P.A.

(57) ABSTRACT

A memory, a system and a method for controlling dynamic burst length control data can generate clocks for both an upstream counter and a downstream counter by using substantially the same latency delayed received command indications. A downstream clock generation circuit generates a clock signal from a received command indication delayed by both a delay locked loop and latency delays stored in latency control circuits. An upstream clock generation circuit generates a clock signal from the received command indication delayed by the delay locked loop and capture indications from the latency control circuits.

29 Claims, 6 Drawing Sheets

DYNAMIC BURST LENGTH OUTPUT CONTROL IN A MEMORY

TECHNICAL FIELD

The present embodiments relate generally to memory and a particular embodiment relates to dynamic burst length output control in a memory.

BACKGROUND

Memory devices are typically provided as internal, semiconductor, integrated circuits in computers or other electronic devices. There are many different types of memory including non-volatile (e.g., flash) memory, random-access memory (RAM), read only memory (ROM), dynamic random access memory (DRAM), and synchronous dynamic random access memory (SDRAM).

An SDRAM can output data in bursts of data that are synchronized with a clock signal. In other words, a certain number of memory cells are accessed and their read data are output in one burst. The length of the data burst can be controlled by programming the burst length to the memory device. The burst length can typically be updated dynamically such that burst length control data from a controller instructs the memory device to output read data in a certain burst length.

FIG. 1 illustrates a schematic diagram of a typical prior art circuit for burst length control in a memory device. The circuit can include a command decoder 100 that receives a command from a controller. The command decoder 100 can decode the type of command that was received (e.g., read, write) and output an indication (e.g., RD, WR) of the command type. An OR gate 101 coupled to the output indications can generate a toggle signal that is input to the clock input of an upstream counter 102. The upstream counter 102 can generate a counter output that changes based on the toggle signal input. Only one of the counter outputs is logically high at any one time. The toggle signal input changes which of these outputs goes to a logical high.

The outputs of the upstream counter 102 are each coupled to a different one of a number of latches 103-106. The inputs of each latch 103-106 are coupled to an address signal bit (e.g., A12). The A12 signal is latched into whichever latch 103-106 has a logical high, from the downstream counter 102, coupled to its latch control input (e.g., LAT). The A12 signal can be used by the controller to set the burst length of the memory device.

The latched A12 signal can then be output through an inverter 140 as a BL4ON signal. The BL4ON signal, is a logical high when the burst length is chosen as a burst length of four. The BL4ON signal is a logical low when the burst length is chosen as a burst length of eight.

The particular latch chosen to output its stored data is chosen by a particular output enable signal from a downstream counter 110. The downstream counter 110 is clocked by support circuitry 130 that includes a delay locked loop (DLL) 132 having shift register outputs coupled to a delay line 131 and a DLL output clock coupled to a pair of registers 134, 135. The DLL shift register outputs provide the delay line 131 with the same delay as that being set by the DLL 132. Thus, the delay in the output of the delay line 131 can match the clock delay present in the DLL clock.

The support circuitry 130 further includes a buffer 133 that is controlled by a signal that instructs the buffer 133 whether the signal coupled to the input of the delay line 131 and, thus, to the input of the buffer 133, is a read or write signal. A write signal is output to the write column address strobe latency register (CWL). A read signal is output to the read column address strobe latency (CL) register. The outputs of these registers 134, 135 are input to a logic gate (e.g., NAND) that then clocks the downstream counter 110.

In order to prevent data from being output from the memory device prematurely (e.g., prior to expiration of the CL), the support logic 130 is responsible for taking into account the column address strobe latency prior to allowing the latched A12 signal to be output. Thus, the decoded read or write control signal is input to the support circuitry 130, delayed by the read or write column address strobe latency, then output to clock the downstream counter 110 to enable the next latch 103-106 to output its stored A12 signal.

A problem can result if there is voltage spike on one of the RD or WR signals, if one of the RD or WR signals arrive prior to the DLL achieving a lock, or one of the RD or WR signals being generated prior to the DLL clock being generated. In any of these cases, one of the upstream 102 or downstream counters 110 can get out of synchronization with the other. Once unsynchronized, the latches 103-106 can output the wrong latched A12 signal for controlling the burst length.

DETAILED DESCRIPTION

Figure 1:
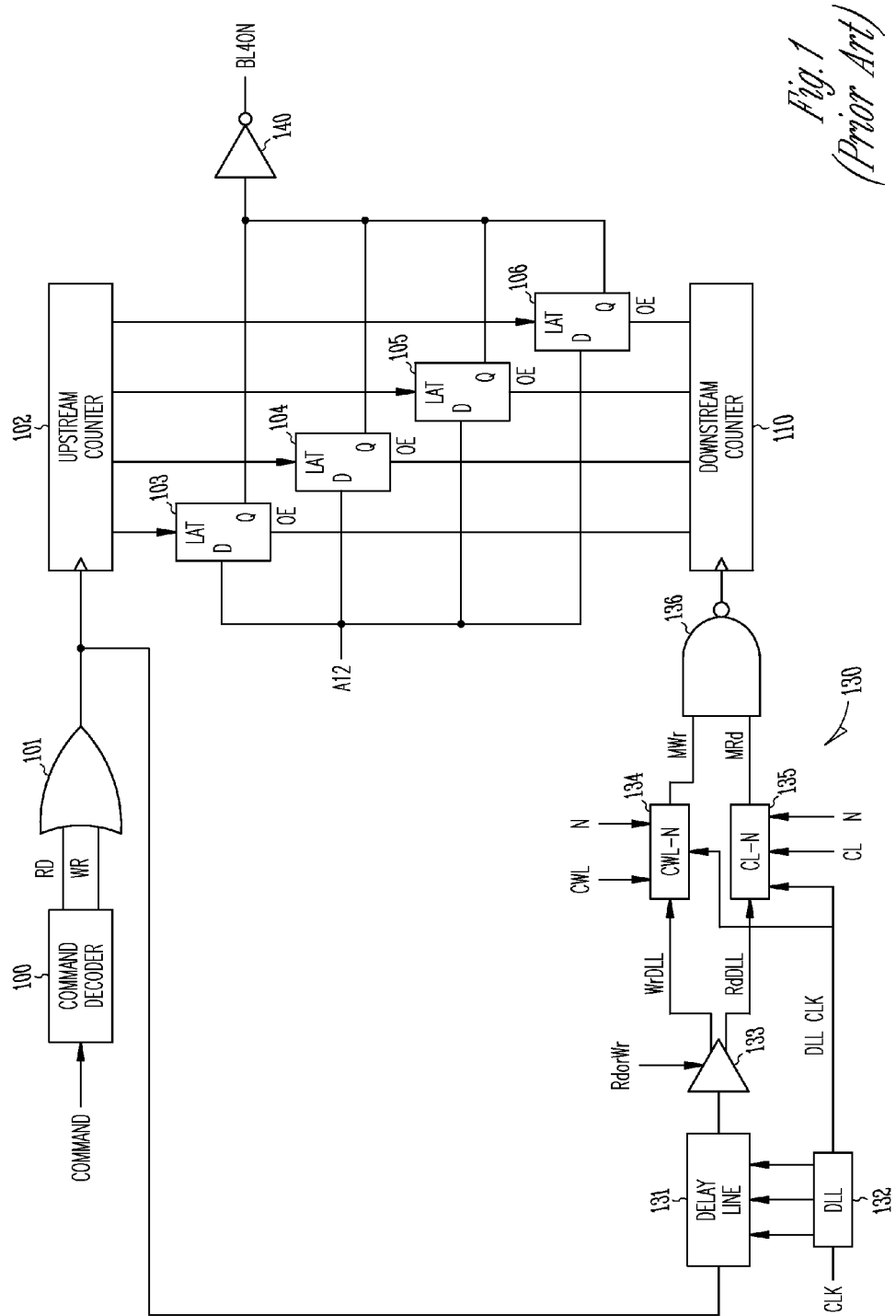
FIG. 1 illustrates a schematic diagram of a typical prior art circuit for generating a burst length control signal.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2A:
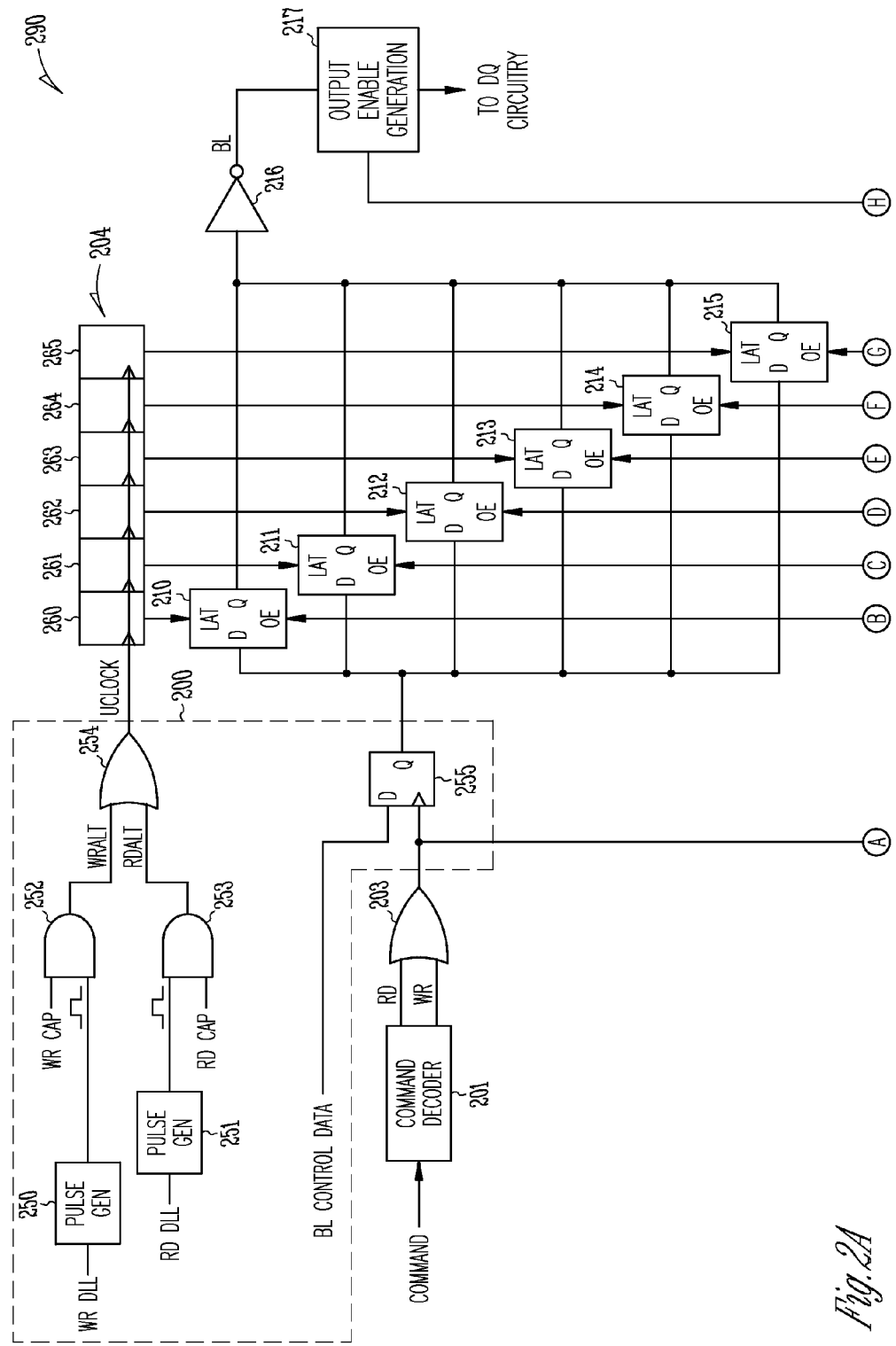
FIGS. 2A and 2B illustrate a schematic diagram of an embodiment of a circuit for generating a dynamic burst length control signal.
Figure 2B:
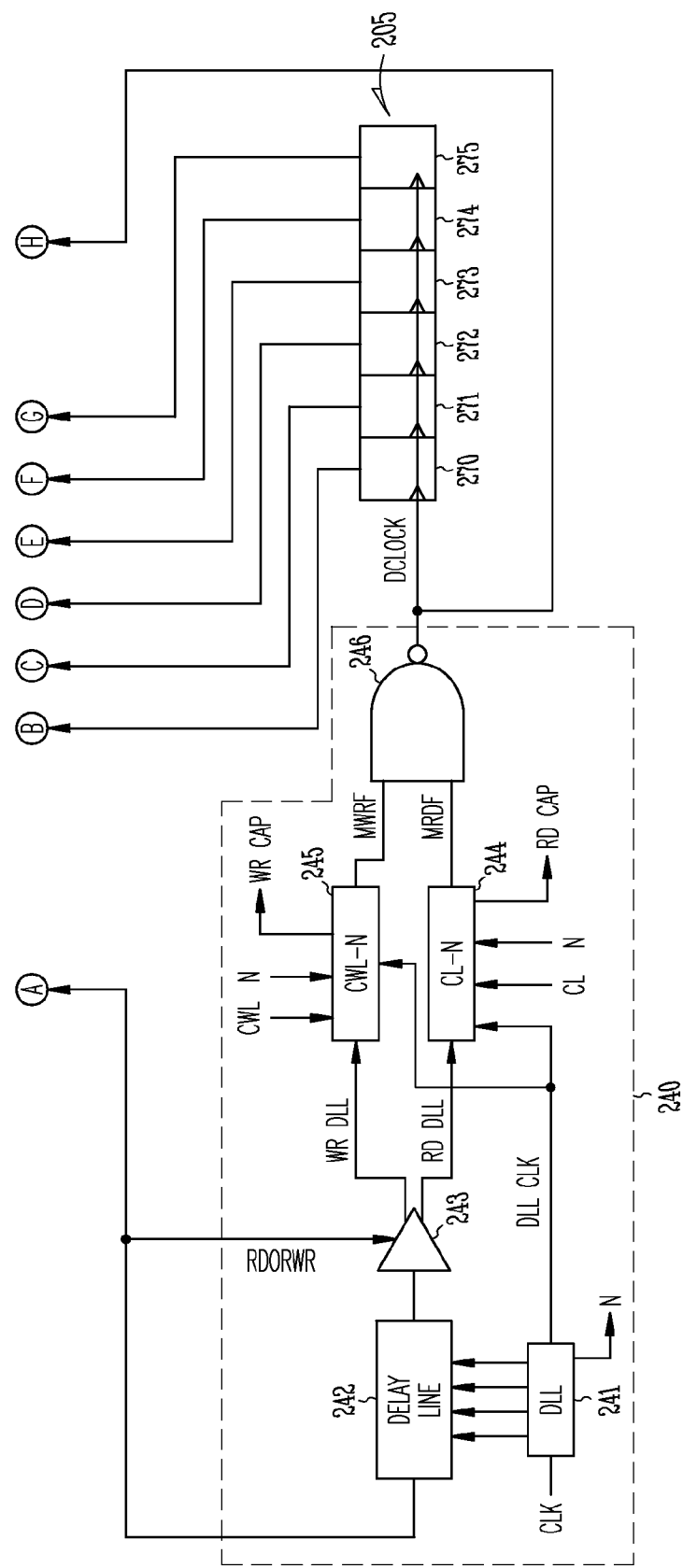

FIGS. 2A and 2B illustrate a schematic diagram of an embodiment of a circuit 290 for generating a dynamic burst length control signal. The illustrated embodiment uses a burst length control data storage circuit 200 to hold received burst length control data (e.g., A12, burst length control bit) of a currently received command. The burst length control data is stored until the next read or write command is received. The burst length control data storage circuit 200 also generates an upstream counter clock signal that is synchronized with a downstream counter clock signal by generating both clocks from the control signals that are in the same DLL CLK domain.

In one embodiment, an address bit from an address received with a received command (e.g., read, write) can be used as the burst length control data. This address bit can be A12 or some other address bit from the currently received address. In other embodiments, more than one address bit can be used or burst length control data that is different from the received address might be used.

The circuit 290 of FIGS. 2A and 2B include a command decoder 201 having two outputs coupled to a logic gate 203 (e.g., OR). The command decoder 201 receives a command and determines the type of command received (e.g., read, write). If the received command is a read command, the command decoder 201 generates a command indication on the RD output (e.g., a logical high). If the received command is a write command, the command decoder 201 generates a command indication on the WR output (e.g., a logical high). The logical gate 203 (e.g., OR) can output an indication signal (e.g., COL) in a first state (e.g., logical high) when either command indication shows that a command has been received and decoded.

An upstream counter 204 can include circuitry, such as a plurality of flip-flops 260-265, that can be coupled to and clocked by a signal from the burst length control data storage circuit 200. The output of each flip flop 260-265 can be coupled to a latch input of a different associated one of a plurality of latches 210-215 (e.g., D flip-flops). Thus, when a particular output of the upstream counter 204 (e.g., from a flip-flop 260-265) transitions to a first state (e.g., logical high), data that is at an input of an associated latch 210-215 is latched into that associated latch 210-215. For example, if the first flip-flop 260 outputs a logical high signal, data that is present at the input of the associated first latch 210 can be latched into that latch.

In the illustrated embodiment, the inputs to the plurality of latches 210-215 are all coupled to an output of the burst length control data storage circuit 200. This circuit 200 can provide the data to the inputs of the latches 210-215 at the appropriate time, as discussed subsequently.

The upstream counter 204 powers up and/or resets to a particular state. In one embodiment, this state is that the left most flip-flop 260 has a logically high output while the remaining flip-flops 261-265 have a logically low output. Alternate embodiments might reverse this logic. During operation, as the upstream counter 204 is clocked, only one of these flip-flops 260-265 has a logically high output at any one particular time. That logical high output state moves sequentially through the series of flip-flops 260-265. Thus, the data input to the latches 210-215, that are output from the burst length control data circuit 200, can then be latched into only one latch at that particular time for each received command. Since the upstream counter output can be a logical high state moving sequentially through the flip-flops 260-265, as each command is received with new burst length control data (e.g., control bit), each new burst length control bit is stored in a different one of the latches 210-215 in sequential fashion in response to its latch input from the upstream counter 204.

The outputs of all of the latches 210-215 can be coupled to a logical gate 216 (e.g., inverter) that can invert the output of an enabled latch 210-215. The output of the logical gate 216 is coupled to an output enable signal generation circuit 217. The output enable signal generation circuit 217 can be configured to generate a signal to the DQ circuitry (e.g., output circuitry) that enables the DQ circuitry to output a particular data burst length in response to the received burst length control data (e.g., A12, burst length control bit).

In one embodiment, if the burst length signal BL from the logical gate 216 is a logical high signal, the DQ circuitry can be enabled by the output enable signal for a burst length of four. If the burst length signal BL from the logical gate 216 is a logical low signal, the DQ circuitry can be enabled by the output enable signal for a burst length of eight. In one embodiment, the output enable signal transitions to a logically high state for the duration of the determined burst length. The logical states of the burst length signal BL and the output enable signal are for purposes of illustration only as an alternate embodiment can use an opposite logical state.

A downstream counter 205 can include circuitry, such as a plurality of flip-flops 270-275, that can be coupled to and clocked by a signal from a column address strobe (CAS) latency CL control circuit 240. The output of each flip-flop 270-275 can be coupled to an output enable input of a different associated one of the plurality of latches 210-215. Thus, when a particular output of the downstream counter 205 (e.g., from a flip-flop 270-275) transitions to a first state (e.g., logical high), data that is stored in the associated latch 210-215 is output to the logic gate 216 and the output enable generation circuit 217. For example, if the first flip-flop 270 outputs a logical high, data that is stored in the associated latch 210 can be output to the logical gate 216.

The downstream counter 205 powers up and/or resets to a particular state. In one embodiment, this state is that the left most flip-flop 270 has a logically high output while the remaining flip-flops 271-275 have a logically low output. Alternate embodiments might reverse this logic. During operation, as the downstream counter 205 is clocked, only one of these flip-flops 270-275 has a logically high output at any one particular time. Thus, only one of the latches 210-215 can output data at that particular time. Since the downstream counter output can be a logical high output state moving sequentially through the flip-flops 270-275, as each command is received with new burst length control data (e.g., control bit), each previous burst length control bit that was stored in a different one of the latches 210-215 can be output in sequential fashion in response to its output enable from the downstream counter 205.

Memory devices (e.g., DRAM) typically have an associated CAS latency (CL). The CL is a time delay between a time at which a memory controller instructs the memory device to access a memory cell on a particular memory column in the memory device and the time the data from the memory cell is available at the memory device's output pins. This delay can be caused by delays in the access command actually reaching the memory cell through various circuits, the time for the accessed data to reach the output pins through various circuits, clock stability and speed, supply voltage, temperature, as well as other factors. In a synchronous memory embodiment, the CL can be specified in clock cycles.

The CL control circuit 240 receives a clock signal CLK and the output signal COL from the decoded command logic gate 203 and, using a particular read or write latency, generates the clocking signal that is coupled to the downstream counter 205. The illustrated components of this circuit 240 are for purposes of illustration only as the function performed by this circuit 240 can be achieved with other circuit architectures.

The CL control circuit 240 includes a delay locked loop (DLL) 241 coupled to the input clock signal CLK. The DLL 241 can be used to change the phase of the clock signal CLK and, thus, cause a negative delay to be imparted to the clock signal CLK. In one embodiment, the DLL may include a delay chain of many delay gates (e.g., delay elements) connected in series, the first of which being connected to the clock signal to be delayed. A shift register in the DLL 241 can set a number of delay elements that are used to achieve a DLL lock. The amount of delay elements used can be defined by the shift register based on the clock signal frequency, supply voltage, and/or temperature. The output of the DLL 241 is the resulting clock signal DLL CLK (e.g., a delayed version of the input clock signal CLK) as well as a plurality of control outputs.

A delay line 242 has an input coupled to the COL signal. The delay line 242 also has inputs coupled to the control outputs from the DLL 241. Since the COL signal should be delayed by the same amount as the input clock signal CLK in order to reach subsequent circuitry (e.g., 243-245) at substantially the same time, the delay line 242 receives control inputs from shift registers of the DLL 241 in order to set a particular number of delay elements used in the delay line 242. Thus, the resulting output of the delay line 242 imparts substantially the same delay on the COL signal as the DLL 241 imparts on the input clock signal CLK.

The output of the delay line 242 is coupled to a switching circuit 243 that outputs one of a WR DLL signal or a RD DLL signal as chosen by a RDORWR select signal. The RDORWR select signal is generated from the RD and WR indications of the command decoder 201 outputs. While the RD and WR indications can be one clock pulse in width, the RDORWR select signal can be a latched signal that stays in its initial state until changed. As an example of operation, when RD goes to a logical high state, RDORWR goes high and stays high until WR goes to a logical high state. Once WR goes to the logical high state, RDORWR goes to a logical low state until RD goes back high again.

Since the received command was decoded to generate the RD or WR signals, depending on what command was decoded, the COL signal (as delayed by the delay line 242) contains one of the RD or WR indications. Thus, the RDORWR select signal can be used to split these signals out again. The generated WR DLL or RD DLL signals are the same WR or RD indications from the command decoder 201 with the imparted negative delay, as determined by the DLL 242. Thus, the WR indication is now the WR DLL signal and the RD indication is now the RD DLL signal.

The switching circuit 243 is coupled to a pair of latency control circuits 244, 245. The RD DLL signal is input to a CL-N latency control circuit 244 while the WR DLL signal is input to a CWL-N latency control circuit 245.

As previously discussed, memory devices can include a CAS latency CL. The CL for a write command can be different than the CL for a read command. Thus, these time periods are subsequently distinguished as CWL for the write latency and CL for the read latency. These latency times CL, CWL are stored in their respective control circuits along with "N" data from the DLL 241. Thus, the CWL-N latency control circuit 245 subtracts the N value from the CWL value to generate the delay imparted by the CWL-N latency control circuit 245 on the WR DLL signal. The CL-N latency control circuit 244 subtracts the N value from the CL value to generate the delay imparted by the CL-N latency control circuit 244 on the RD DLL signal.

The N data generated by the DLL 241 is closed-loop delay information that can be calculated by the DLL 241 during its locking operation. The DLL's closed-loop delay can be the same as the input clock signal's minimum forward path delay from the external clock signal CLK to the DQ circuitry.

Each latency control circuit 244, 245 can be responsible for generating delayed versions of the received command. For example, the CL-N latency control circuit 244 delays the RD DLL signal by the read latency CL minus the N data from the DLL 241. Similarly, the CWL-N latency control circuit 245 delays the WR DLL signal by the write latency CWL minus the N data from the DLL 241. The output of the read CL-N latency control circuit 244 is the MRDF signal while the output of the write CWL-N latency control circuit 245 is the MWRF signal.

The outputs of the latency control circuits 244, 245 are coupled to the inputs of a logical gate (e.g., NAND) to be logically combined. The output of this logical gate 246 DCLOCK can be used to clock the downstream counter 205 as previously discussed. The output enable signal generation circuit 217 is also synchronized to the DCLOCK signal from the CL control circuit 240.

The latency control circuits 244, 245 can also generate additional signals, WR CAP and RD CAP, that can be used by the burst length control data circuit 200. The CL-N latency circuit 244 generates the RD CAP signal at the moment that the DLL CLK signal clocks the RD DLL signal into the CL-N latency circuit 244. The CWL-N latency circuit 245 generates the WR CAP signal at the moment that the DLL CLK signal clocks the WR DLL signal into the CWL-N latency circuit 245. The WR CAP and RD CAP can be referred to as latency delayed command capture indications or signals.

The burst length control data circuit 200 includes a write command pulse generator 250 coupled to the WR DLL output of the switching circuit 243. A read command pulse generator 251 is coupled to the RD DLL output of the switching circuit 243. The pulse generators 250, 251 generate a pulse in response to a transition of its respective input signal WR DLL, RD DLL. In one embodiment, each pulse generator 250, 251 generates a positive going pulse on the falling edge of its respective input signal WR DLL, RD DLL.

The output of the write command pulse generator 250 is logically combined (e.g., logically ANDed) with the WR CAP signal from the CWL-N latency circuit 245. The output of the read command pulse generator 251 is logically combined (e.g., logically ANDed) with the RD CAP signal from the CL-N latency circuit 244. The outputs of the logic gates 252, 253 are coupled to another logic gate 254 (e.g., OR) to be logically combined as an output UCLOCK to clock the upstream counter 204.

The burst length control circuit 200 also includes a latch 255 (e.g., D flip-flop) that has a clock input coupled to the output of the command decoder logic gate 203. The input of the latch 255 is coupled to the burst length control data (e.g., A12, burst length control bit). Thus, received burst length control data can be latched by one of the RD or WR indications from the logic gate 203 and remains latched until the next received command to be decoded. If the burst length control data comprises more than one bit, additional latches can be used. The output of the latch 255 can be coupled to the inputs of all of the latches 210-215 in order to supply the latched burst length control data to these latches.

The WR CAP and RD CAP signals can be used instead of the related MWRF and MRDF signals due to the WR CAP and RD CAP signals occurring earlier than the MWRF and MRDF signals (due to timing within the CL-N and CWL-N latency circuits 244, 245). Since the burst length control data (e.g., A12, burst length control bit), that is latched into the latch 255 of the burst length control circuit 200, can be replaced with new data when a new command has been received and decoded, the UCLOCK signal should clock the upstream counter 204 while the current burst length control data is latched.

Figure 3:
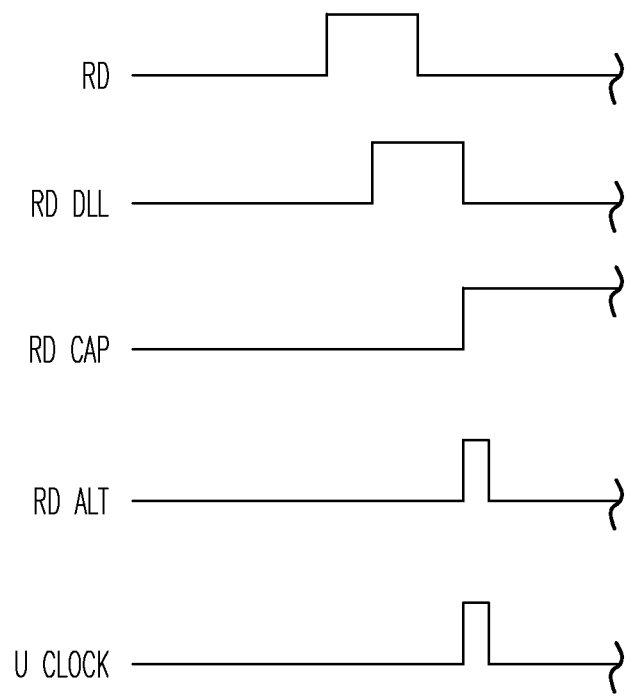
FIG. 3 illustrates a timing diagram in accordance with the embodiment of FIGS. 2A and 2B.

FIG. 3 illustrates a timing diagram of one embodiment of the operation of FIGS. 2A and 2B. The signals illustrated in FIG. 3 are for a possible read operation. The signals for a write operation may be substantially similar except for being on the write lines (e.g., WR, WR DLL, MWRF, WRALT) of the schematic diagram. The signals illustrated in FIG. 3 are for only one possible implementation of the present embodiment. Alternate embodiments might use different logic so that the implemented signals could have inverse logic states from those illustrated.

The timing diagram shows a positive pulse an indication of a decoded read signal RD. This pulse is used in the latency CL control circuitry 240 to generate the RD DLL signal that is shown as a delayed positive pulse. When the RD DLL signal is captured in the CL-N latency circuit 244, the RD CAP signal goes to a high state. A positive pulse is generated in response to the RD DLL signal pulse and logically combined (logically AND'ed) with the RD CAP signal to generate the positive RD ALT pulse. The UCLOCK plus is then generated in response to the RD ALT pulse and is used to clock the upstream counter 204.

Figure 4:
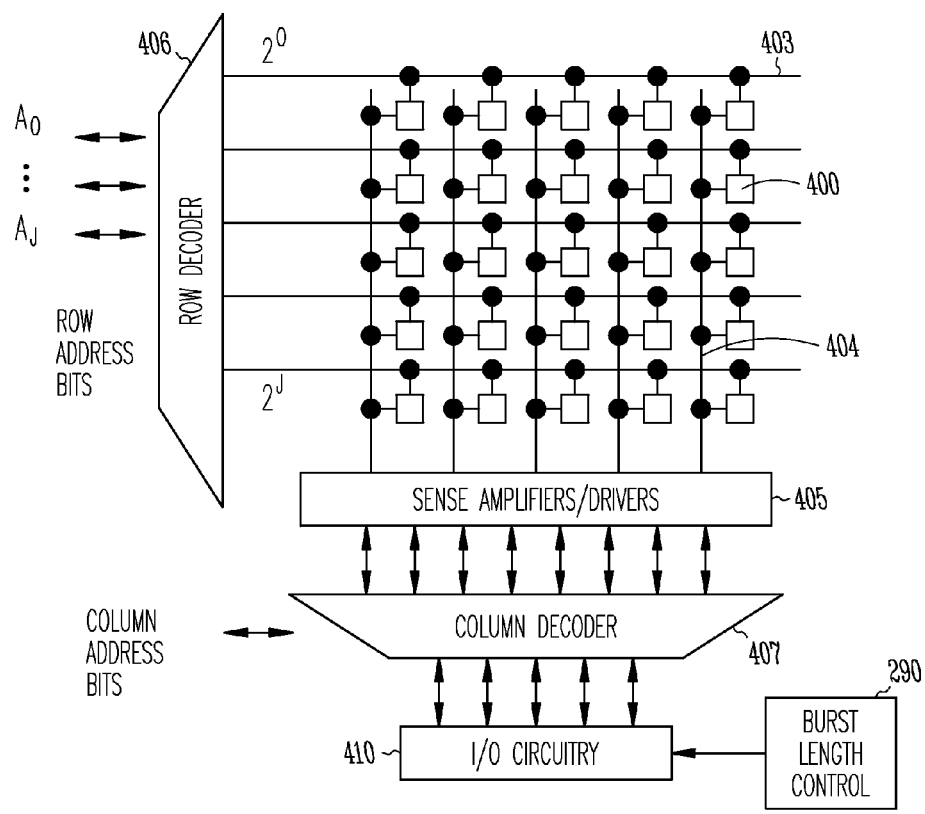
FIG. 4 illustrates a schematic diagram of an embodiment of a memory device.

FIG. 4 illustrates a block diagram of an embodiment of a memory device (e.g., DRAM) that can incorporate the circuit for generating a dynamic burst length control signal of FIGS. 2A and 2B. The device comprises a plurality of memory cells 400, each memory cell 400 being coupled between an access line (e.g., word line) 403 and a digit line 404.

The digit lines 404 are coupled to sense amplifiers/drivers 405 that can sense the states of the memory cells 400. The sensing can occur through sense amplifiers when the memory cell capacitors are coupled to the digit lines through their respective enabled control transistor.

A row decoder 406 is coupled to the word lines 403 to generate the word line signals in response to a row address from a controller. A column decoder 407 is coupled to the sense amplifiers/drivers 405 and generates a column address through drivers onto the digit lines 404 in response to a column address from the controller. The column decoder 407 also outputs the sensed states from the memory cells 400 as well as accepts the data to be stored in the memory cells 400.

The outputs from the column decoder 407 are input to the input/output (I/O) circuitry 410. The I/O circuitry 410 can include the DQ circuitry as well as the controlling circuitry that enables the output of certain burst lengths of data in response to the burst length control circuit 290 as described previously.

Figure 5:
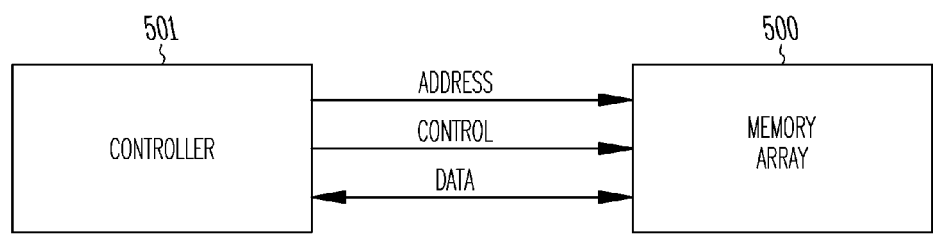
FIG. 5 illustrates a block diagram of an embodiment of a system.

FIG. 5 illustrates a block diagram of an embodiment of a system in accordance with the embodiment of FIGS. 2 and 3. The system can include a controller 501 (e.g., control circuitry, microprocessor) coupled to a memory array 500 over address, control, and data buses. In one embodiment, the controller 501 and memory array 500 are part of the same DRAM device. In an alternate embodiment, the memory array 500 is part of a memory device and the controller 501 is a separate integrated circuit.

CONCLUSION

One or more embodiments provide clocking for both upstream and downstream counters that are based on the same delays. Both the upstream and downstream counter clocks can be generated, and synchronized, in response to the control signals that are in the same DLL CLK domain. Thus, the synchronization of the burst length control data latching with the burst length control data output enable may be improved.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
    a plurality of latches configured to latch burst length control data;
    a first counter, coupled to the plurality of latches, configured to generate a latch signal to each of the plurality of latches;
    a second counter, coupled to the plurality of latches, configured to generate an output enable signal to each of the plurality of latches;
    a first circuit coupled to the first counter and the plurality of latches and configured to generate a first clock signal for the first counter responsive to latency delays of the memory device, the first circuit further configured to store the burst length control data; and
    a second circuit coupled to the second counter and configured to generate a second clock signal for the second counter responsive to a received command and the latency delays of the memory device.

2. The memory device of claim 1 wherein each of the plurality of latches is configured to latch different burst length control data.

3. The memory device of claim 1 wherein the second circuit comprises a delay locked loop configured to delay a received clock signal.

4. The memory device of claim 1 and further comprising a command decoder configured to generate a command indication responsive to the received command.

5. The memory device of claim 4 wherein the first circuit further comprises a latch coupled to the command decoder wherein the command indication is configured to latch the burst length control data into the latch.

6. The memory device of claim 1 wherein the first counter is configured to generate only one latch signal to only one latch at any one time.

7. The memory device of claim 1 wherein the second counter is configured to generate only one output enable signal to only one latch at any one time.

8. A memory device comprising:
    a command decoder configured to generate a received command indication responsive to a received command;
    a plurality of latches, each latch configured to latch a burst length control bit;
    a first counter coupled to the plurality of latches and configured to generate a latch signal to each of the plurality of latches at different times to latch the burst length control bit into one of the plurality of latches;
    a second counter coupled to the plurality of latches and configured to generate an output enable signal to each of the plurality of latches;
    a first circuit coupled to the first counter and the plurality of latches and configured to generate a first clock signal for the first counter responsive to latency delays of the memory device, the first circuit further configured to store the burst length control bit responsive to the received command indication; and
    a second circuit coupled to the second counter and configured to generate a second clock signal for the second counter responsive to the received command indication, a received clock, and the latency delays of the memory device.

9. The memory device of claim 8 wherein the first counter is configured to generate a plurality of latch signals such that the burst length control bit is sequentially latched into each of the plurality of latches responsive to each received command indication.

10. The memory device of claim 8 wherein the first counter comprises a plurality of flip-flops that are configured to move a first logical output state sequentially through the plurality of flip-flops responsive to the first clock signal.

11. The memory device of claim 8 wherein the second counter comprises a plurality of flip-flops that are configured to move a first logical output state sequentially through the plurality of flip-flops responsive to the second clock signal.

12. The memory device of claim 8 wherein the second circuit comprises:
a delay locked loop coupled to the received clock and configured to generate a delayed clock;
a delay line coupled to the command decoder and configured to generate a delayed command indication responsive to a delay of the delay locked loop;
a switching circuit coupled to the delay line and configured to output one of a first delayed command indication or a second delayed command indication;
a first latency control circuit coupled to the switching circuit and configured to store a first latency delay of the memory device and generate a first latency delayed command indication, the first latency control circuit further configured to generate a first latency delayed command capture signal;
a second latency control circuit coupled to the switching circuit and configured to store a second latency delay of the memory device and generate a second latency delayed command indication, the second latency control circuit further configured to generate a second latency delayed command capture signal; and
a logic gate coupled to the first and second latency control circuits and configured to generate the second clock signal responsive to one of the first or the second latency delayed command capture signals.

13. The memory device of claim 12 wherein the first circuit comprises:
a first pulse generator coupled to the switching circuit and configured to generate a first pulse responsive to the first delayed command indication;
a second pulse generator coupled to the switching circuit and configured to generate a second pulse responsive to the second delayed command indication; and
a plurality of logic gates coupled to both the first and second pulse generators and to the first and second latency control circuits, the plurality of logic gates configured to generate the first clock signal responsive to the first or second pulses and the first or second latency delayed command capture signals.

14. The memory device of claim 13 wherein the plurality of logic gates comprise:
a first logical gate coupled to the first pulse generator and the first latency control circuit and configured to generate a first logical state output responsive to the first latency delayed command capture signal and the first delayed command indication;
a second logical gate coupled to the second pulse generator and the second latency control circuit and configured to generate the first logic state output responsive to the second latency delayed command capture signal and the second delayed command indication; and
a third logical gate coupled to the first and second logical gates and configured to output the first clock signal responsive to one of the first or the second logical gates outputting the first logical state.

15. The memory device of claim 12 wherein the first latency control circuit is configured to store a write latency of the memory device and the second latency control circuit is configured to store a read latency of the memory device.

16. The memory device of claim 12 wherein the first latency control circuit is a write latency control circuit configured to store a write latency delay of the memory device, generate a write latency delayed command indication, and a write latency delayed command capture signal.

17. The memory device of claim 12 wherein the second latency control circuit is a read latency control circuit configured to store a read latency delay of the memory device, generate a read latency delayed command indication, and a read latency delayed command capture signal.

18. A method for synchronizing a first counter clock with a second counter clock in a memory having a latency, the method comprising:
generating a command indication responsive to a received command;
generating the first counter clock from a first clock generating circuit responsive to a delayed received command indication and a latency delayed received command indication; and
generating the second counter clock from a second clock generating circuit responsive to the delayed received command indication and the latency delayed received command indication.

19. The method of claim 18 and further comprising:
receiving burst length control data with the received command; and
generating latched burst length control data by latching the received burst length control data in a latch responsive to the command indication.

20. The method of claim 19 and further comprising:
clocking a first counter with the first counter clock such that a first logical output state is moved sequentially through a plurality of outputs of the first counter; and
clocking a second counter with the second counter clock such that the first logical output state is moved sequentially through a plurality of outputs of the second counter.

21. The method of claim 20 wherein each of the plurality of outputs of the first counter is coupled to a different latch of a plurality of latches such that the first logical output state sequentially latches the latched burst length control data to a different latch of the plurality of latches.

22. The method of claim 20 wherein each of the plurality of outputs of the second counter is coupled to a different latch of a plurality of latches such that the first logical output state sequentially enables an output enable of a different latch of the plurality of latches.

23. A method for controlling dynamic burst length control in a memory, the method comprising:
generating a command indication from a received command;
generating a latched burst length control bit in a latch responsive to the command indication;
latching the latched burst length control bit in a particular one of a plurality of latches responsive to a latch signal from a first counter;
generating an output enable signal from a second counter, the output enable signal configured to output the latched burst length control bit from the particular one of the plurality of latches to memory input/output circuitry;
clocking the first counter with a first clock generated responsive to a delayed command indication and a latency delayed command capture indication; and
clocking the second counter with a second clock generated responsive to the delayed command indication and a latency delayed command indication.

24. The method of claim 23 and further comprising resetting the first and second counters such that a first flip-flop of a plurality of flip-flops for each of the first and second counters is at a first logical state while remaining flip-flops for each of the first and second counters are at a second logical state.

25. The method of claim 24 wherein the first logical output state is moved sequentially through each of the plurality of flip-flops for each of first and second counters responsive to their respective first and second clocks.

26. The method of claim 23 and further comprising:
generating a first pulse from a first delayed command indication;
generating a second pulse from a second delayed command indication;
generating the first clock signal from a logical combination of the first pulse and a first latency delayed command capture indication or a logical combination of the second pulse with a second latency delayed command capture indication.

27. A system comprising:
a controller; and
a memory array coupled to the controller and having an associate latency, the memory array comprising:
a burst length control bit latch configured to latch a received burst length control bit responsive to a command indication;
a plurality of latches configured to store the burst length control bit from the burst length control bit latch;
a first counter coupled to the plurality of latches and configured to sequentially generate a latch signal in turn to each of the plurality of latches to latch the burst length control bit;
a second counter coupled to the plurality of latches and configured to sequentially generate an output enable signal in turn to each of the plurality of latches to output the latched burst length control bit to memory input/output circuitry; and
a circuit coupled to the first counter and configured to generate a clock for the first counter responsive to a delayed received command indication and a latency delayed received command capture indication.

28. The system of claim 27 wherein the circuit is a first circuit and the clock is a first clock, the system further comprising:
a second circuit coupled to the second counter and configured to generate a second clock for the second counter responsive to the delayed received command indication and a latency delayed received command indication.

29. A memory device comprising:
a plurality of latches configured to latch burst length control data;
a first counter, coupled to the plurality of latches, configured to generate a latch signal to each of the plurality of latches responsive to a first clock signal;
a second counter, coupled to the plurality of latches, configured to generate an output enable signal to each of the plurality of latches responsive to a second clock signal; and
circuitry configured to generate the first and second clock signals from the same delay.

* * * * *